United States Patent [19]

Chen et al.

[11] 4,198,691
[45] Apr. 15, 1980

[54] COMPACT EXCHANGE SWITCH FOR BUBBLE DOMAIN DEVICES

[75] Inventors: Thomas T. Chen; Isoris S. Gergis, both of Yorba Linda, Calif.

[73] Assignee: Rockwell International Corporation, El Segundo, Calif.

[21] Appl. No.: 933,235

[22] Filed: Aug. 14, 1978

Related U.S. Application Data

[63] Continuation of Ser. No. 688,652, May 21, 1976, abandoned.

[51] Int. Cl.² ............................................. G11C 19/08
[52] U.S. Cl. ........................................ 365/15; 365/35
[58] Field of Search ..................................... 365/15, 16

[56] References Cited

U.S. PATENT DOCUMENTS

| 3,713,116 | 1/1973 | Bonyhard et al. | 365/15 |
| 4,007,453 | 2/1977 | Bonyhard et al. | 365/15 |
| 4,086,661 | 4/1978 | Matsuyama et al. | 365/15 |

Primary Examiner—James W. Moffitt
Attorney, Agent, or Firm—H. Fredrick Hamann; Daniel R. McGlynn; Richard A. Bachand

[57] ABSTRACT

A magnetic bubble domain circuit component for selectively, substantially concurrently, exchanging bubble domains from adjacent propagation paths. The exchange switch defined herein is an active (i.e. a control current is required) switch. The improved design of the exchange switch permits bubble domain exchanges in a minimum time and distance in a magnetic bubble domain circuit.

14 Claims, 5 Drawing Figures

COMPACT EXCHANGE SWITCH FOR BUBBLE DOMAIN DEVICES

This is a continuation application of parent application Ser. No. 688,652, filed May 21, 1976, now abandoned.

BACKGROUND

1. Field of the Invention

This invention is directed to a magnetic bubble domain circuit component, in general, and to a compact exchange switch which exchanges magnetic bubble domains between adjacent propagation paths in a magnetic bubble domain circuit, in particular.

2. Prior Art

Existing magnetic bubble domain circuits and systems utilize many kinds of components or devices. These components and devices are appropriately arranged to define paths for bubble domain propagation. In order to provide optimum utilization of magnetic bubble domain technology, it is frequently desirable to utilize systems or chip organizations having a plurality of such propagation paths. Typically, these paths may take the form of adjacent parallel paths, or adjacent loops and paths such as in a major/minor loop organization. The particular organization depends upon storage capacity desired, logic operations or the like. Some exchange switches require a large amount of operating time and space to exchange information from adjacent paths. Exchange switches of this type sometimes require as many as four (4) bits separation between two adjacent circuits in order to effect an appropriate exchange. These exchange switches typically take the form of a double switch arrangement. This requirement (i.e. a double switch arrangement) somewhat limited the minimum size of the data block which could be processed in the chip configuration. In addition, in the known prior art arrangements, the data blocks had to be closely synchronized by external control means in order to provide a workable system. These control means could include multiplexing techniques for better data throughout.

In known major/minor loop organizations, suitable transfer switches (e.g. the dollar ($) switch) are available. However, these transfer switches typically require all of the information in a loop to be removed (or stored) at one time. This is, transfer of information is permitted in only one direction at a time. The known transfer switches do not permit the concurrent exchange of information between the major and the minor loops. While the major/minor loop arrangement is faster than single storage loop arrangements, it is still relatively time consuming. Moreover, these arrangements are not very flexible in that entire blocks of information must be handled. Small portions of information blocks are not readily utilized. Thus, it is clear that the existing chip organizations and system arrangements require excessive amounts of chip capacity in order to effect exchange of information. In addition, the system is hampered in throughput rate because of extensive time requirements for data interchange.

SUMMARY OF THE INVENTION

The instant invention relates to compact, relatively simple exchange switches for exchanging information between two adjacent propagation paths concurrently. Typically, the switches are active exchange switches which selectively permit information in the form of magnetic bubbles to be transferred from one propagation path to another (and vice versa) concurrently in response to a control signal. Inasmuch as the exchange takes place concurrently, synchronization of information in the respective paths is maintained.

DESCRIPTION OF THE PREFERRED EMBODIMENT

Figure 1:
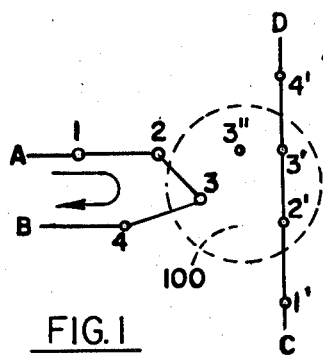
FIG. 1 is a schematic representation of a pair of adjacent propagation paths in the bypass mode.

Referring now to FIG. 1, there is shown a schematic representation of a pair of adjacent propagation paths in a magnetic bubble domain system. One path, A-B, is schematically shown in a form representative of a loop. However, path A-B (including locations 1, 2, 3 and 4) can be a relatively straight line. The other path, C-D, (including locations 1', 2', 3' and 4') is adjacent to path A-B. As noted, path A-B may be substantially parallel to path C-D. Conversely, path C-D may be another loop path or the like.

As depicted in FIG. 1, the adjacent paths A-B and C-D represent propagation paths of any suitable type wherein magnetic bubble domains propagate from A to B or from C to D as indicated by the arrows. This arrangement, referred to as the "by-pass" is typical in many magnetic bubble domain systems and represents the circuit condition when the switch 100 which forms the instant invention is not activated. In this condition, the bubbles will propagate along the respective paths in response to a rotating field $H_R$ (not shown).

Figure 2:
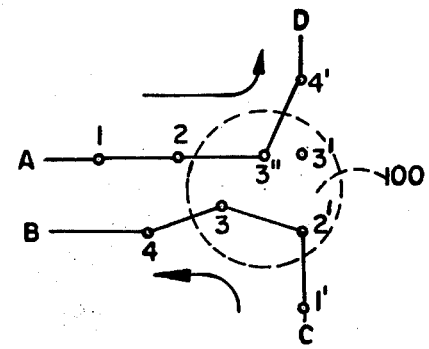
FIG. 2 is a schematic representation of the same adjacent propagation paths in the exchange mode in response to the application of a control signal.

Referring now to FIG. 2, there is shown a schematic representation of the same propagation paths when the exchange switch 100 of the instant invention has been activated. As will become readily apparent hereinafter, the switch is activated by application of a control current. In this representation, referred to as the "exchange mode", the bubble path is now A-D via locations 1, 2, 3" and 4'. It is noted that location 3" is a location included in exchange switch 100 but which is not in one of the original propagation paths. Similarly, the other bubble path is now C-B via locations 1', 2', 3 and 4. It should be clear that a bubble from location 2' (of original path C-D) is propagated to location 3 of original propagation path A-B. Likewise, a bubble at location 2 (in original path A-B) is propagated to location 4' (in original path C-D) via location 3". In this instance, location 3' is omitted from the propagation paths wherein bubbles can be exchanged concurrently between path A-B and path C-D. In addition, and more importantly, a single bubble may be exchanged from each path with a minimum of difficulty and with no loss of storage space. That is, a bubble at location 2' is supplied to location 3 rather than to location 3'. At the same time, bubble information at location 2 is transferred to location 3". Thus, information from loop A-B is removed from the loop (at location 3") while information from path C-D is inserted into the A-B loop (at location 3). During the next circuit operation, the information at location 3″ is transferred to location 4′ to fill, in synchronism, the void produced in the stream of information in path C-D. Consequently, it is clear that the information flow in path C-B and A-D is continuous with no gaps or delays.

Figure 3:
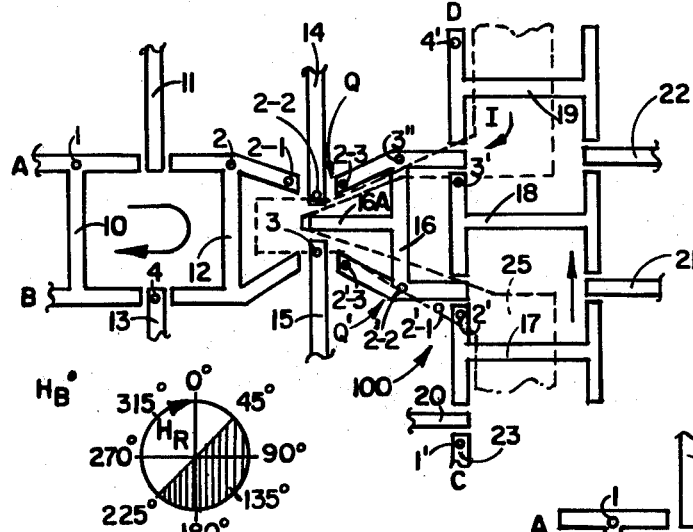
FIG. 3 is a diagramatic representation of one embodiment of the exchange switch of the instant invention.

Referring now to FIG. 3, there is shown a schematic diagram of one embodiment of exchange switch 100. In the embodiment shown in FIG. 3, the propagation path A-B includes locations 1, 2, 3 and 4 which are basically defined as resting points (or locations) for magnetic bubble domains when the rotating field $H_R$ is in the vertical position. This position is defined herein as the 0° position. In particular, path A-B comprises H-bar 10 and twisted H-bar 12 along with I-bars 11 and 13 therebetween. In addition, I-bars 14 and 15, along with bar 16A of twisted H-bar 16, can be provided to enhance the operation of path A-B. These devices are well known in the art and the operation thereof in response to a rotating magnetic field $H_R$ is also known.

Likewise, propagation path C-D comprising locations 1′, 2′, 3′ and 4′ comprises a plurality of H-bars 17, 18 and 19 along with I-bars 20, 21 and 22 arranged in a suitable manner. Portions of twisted H-bar 16 can be included in path C-D in a manner similar to I-bar 20. Again, these components are well known in the art and operate in a standard fashion.

The mechanism which couples the propagation paths together and forms the exchange path therebetween is modified, twisted-H component 16. Twisted H component 16 includes an extended member 16A which extends substantially perpendicularly from the cross bar of the H and substantially bisects the cross bar as well. In addition, I-bar elements 14 and 15 are interposed between the twisted ends of twisted-H elements 12 and 16 and located adjacent to the end of extended member 16A of H-bar 16. In this embodiment, I-bars 14 and 15 are substantially perpendicular to member 16A.

A suitable conductor element 25 is disposed adjacent to twisted-H element 16. In the embodiment shown, conductor 25 is provided along propagation path C-D with a substantially triangularly shaped portion which is arranged relative to twisted-H element 16 and, to a lesser extent, twisted-H element 12 to direct the flow of magnetic bubble domains through the switch.

In the unactivated status, no control current I is supplied to conductor 25 whereby conductor 25 has no influence on the circuits. Consequently, bubbles propagate along path C-D through locations 1′, 2′, 3′, 4′. Likewise, bubbles propagate through path A-B along locations 1, 2, 3 and 4.

However, in order to effect a transfer of a bubble from one path to another, current is applied to conductor 25 by a suitable source (not shown) during the appropriate portion of the cycle of the rotating field $H_R$. In particular, in the instant embodiment, the control current is applied for approximately ½ of the cycle of rotating field $H_R$. This portion of the cycle is chosen to occur when the bubbles are at locations Q and Q′ (which generally correspond to the 45° and 225° positions of the $H_R$ cycle).

In particular, the current in conductor 25 has the net effect of establishing a magnetic field and, thus, a pole relative to the conductor when the current is applied. If the current is applied starting when the field phase is approximately 45° (and continuing until the field has reached 225°), it is seen that the bubbles are diverted from the previously established path, i.e. A-B or C-D, along the twisted bars of twisted-H element 16, respectively. In particular, the bubble at location 2′, in response to a control current in conductor 25, follows the path defined by locations 2′-1, 2′-2 and 2′-3 until location 3 is reached at which time the bubble then proceeds along path A-B from location 3 toward location 4.

Conversely, a bubble at location 2 propagates to locations 2-1, 2-2, 2-3 and 3″ under the influence of the control current. Again, the bubble propagates at location 3″ toward location 4′ in path C-D.

To demonstrate that the bubbles from paths A-B and C-D are exchanged without loss of synchronism or propagation throughput, it is noted that bubbles are at locations 2 and 2′ when field $H_R$ is in the vertical or 0° position. When field $H_R$ reaches the 45° position, no substantial change has taken place in the location of the bubbles at locations 2 and 2′ inasmuch as no other magnetic poles have been produced by the rotating field $H_R$. At about this time, the control current is applied to conductor 25. However, when field $H_R$ reaches the 90° position, a magnetic pole is produced at the right end of the lower side element of twisted-H element 16. Thus, a bubble at location 2′ tends to be attracted to this pole. However the magnetic field produced by the current in conductor 25 causes the bubble to slide (strip out) to the left along the lower element of twisted-H 16.

When field $H_R$ reaches the 135° position, a magnetic pole is established at the right end of the upper portion of twisted-H element 12 wherein the bubble assumes location 2′-1. Likewise, a relatively weak pole is produced at the junction of the side element and the cross member of twisted-H member 16 wherein the bubble is attracted toward position 2′-2.

As the rotating field $H_R$ reaches the 180° position, magnetic poles are produced at the bottom end of I-bar 14 and at the intersection of the vertical cross member and the bottom member of twisted-H element 16. Thus, the bubbles assume positions at locations 2′-2 and 2-2, respectively.

Now, as the rotating field $H_R$ rotates to the 225° and the 315° positions, respectively, magnetic poles are formed at the opposite ends of the twisted members of twisted-H elements 16 wherein the bubbles assume the 2-3 (225°) and the 2′-3 (315°) positions. When the rotating field $H_R$ returns to the 0° position, magnetic poles are produced at the upper ends of I-bar 15 and the vertical cross member of twisted-H element 16 wherein bubbles assume locations 3 and 3″, respectively. Thus, it is seen that a bubble from location 2′ reaches location 3 in one cycle or revolution of rotation field $H_R$. This is the same time which would be required to transfer a bubble from location 2 to location 3 in path A-B. Likewise, a bubble from location 2 is transferred to location 3″ in one field revolution. This is the same time it would take a bubble to transfer from position 2′ to position 3′. Bubbles at positions 3′ and 3″ are, thus, in a position to be transferred to the end of upper portion of twisted-H element 16 when the rotating field achieves the 90° position in the next revolution. Consequently, it is clear that the bubble at location 2′ exactly replaces at location 3 the bubble which has been propagating through path A-B and which was located at location 2. Likewise, the bubble which was at location 2 exactly replaces the bubble which has been at location 2′.

If now the control current is removed from conductor 25, the field and poles produced thereby are removed as well. Under these conditions, paths A-B and C-D are returned to the original integrity and no transfers or exchanges occur. Consequently, it is evident that by the simple mechanism of applying a current through conductor 25 relative to the exchange switch shown and described herein, a single bubble may be exchanged between propagation paths. By reapplying or continuing the application of the control current, any number of bubbles may be exchanged from one path to the other. Moreover, it is important to note that the exchange is on a one-for-one basis requiring a minimum amount of space and a minimum amount of cycle time wherein both data throughput and chip space utilization are maximized. That is, all of the information in a particular loop need not be transferred. Moreover, delays in propagation are not required.

Figure 4:
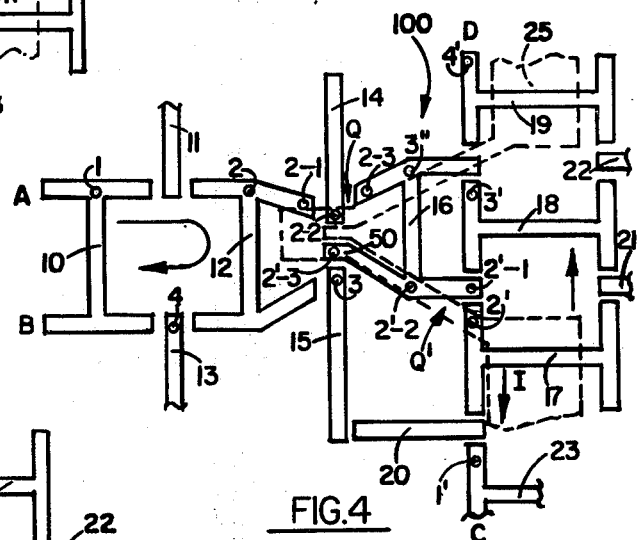
FIG. 4 is a diagramatic representation of another embodiment of the instant invention.

Referring now to FIG. 4, there is shown a diagramatic representation of another embodiment of the instant invention. In this embodiment, the elements which are similar to those shown in the embodiment of FIG. 3 bear common reference numerals. It will be noted that the significant difference between the embodiments of FIGS. 3 and 4 is in the configuration of twisted-H element 16. In the embodiment of FIG. 4, the bottom-left portion of twisted-H 16 is extended and includes the nose or end portion 50 which is disposed between the ends of I-bars 14 and 15. The element 16A (see FIG. 3) is omitted. Nevertheless, the intermediate exchange locations 2'-1, 2'-2 and 2'-3 are provided. Again, intermediate location 2'-3 is located in the end portion 50 of twisted-H element 16. Thus, the end portion 50 provides a portion of the propagation path in the A-B path as well as in the exchange path from path C-D.

The operation of the embodiment shown in FIG. 4 is substantially similar to the operation of the embodiment shown in FIG. 3. However, in the operation of the embodiment of FIG. 4, the bubble from location 2', in the exchange process, transfers to location 2'-3 which is at the end of element 50 rather than at the end of portion 16A of element 16. Inasmuch as the operation is otherwise similar, a detailed discussion of this operation is not repeated.

Figure 5:
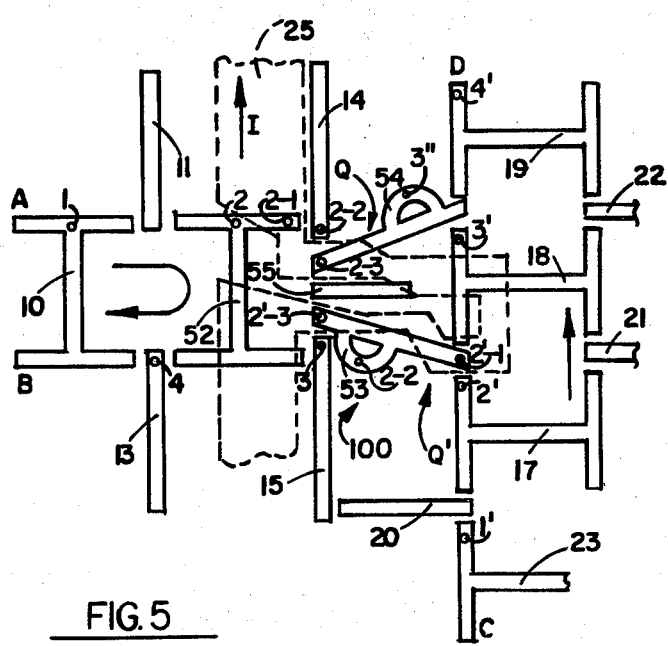
FIG. 5 is a diagramatic representation of another embodiment of the instant invention.

Referring now to FIG. 5, there is shown another embodiment of the instant invention. Again, elements which are similar to the components shown in FIGS. 3 and 4 bear similar reference numerals.

In the embodiment shown in FIG. 5, H-bar 52 replaces twisted H-bar element 12. Although this substitution is not absolutely essential, it may be desirable in order to provide ease in device structure and configuration.

In the embodiment shown in FIG. 5, twisted-H bar elements 16 is replaced with a modified dollar sign switch. The modified dollar sign switch comprises elements 53, 54 and 55. A dollar sign switch is known in the art (see, for example, U.S. Pat. No. 3,714,639 Kish et al). In the known dollar sign switch, elements 53 and 54, as shown in FIG. 5, would be essentially combined or superimposed wherein the elongated bar is a common bar and the loops are on opposite sides and opposite ends of the common bar. However, the known dollar sign switch is typically used as a transfer switch between the respective loops in a major/minor loop configuration. In addition, conductor 25 in FIG. 5 is somewhat differently disposed due to the different arrangement of the elements. Nevertheless, conductor 25 provides a magnetic field which directs the movement of bubbles through the system.

In operation, it is seen that the left ends of elements 54, 55 and 53 form magnetic poles as the field $H_R$ rotates counterclockwise wherein a bubble propagates through path A-B. Likewise, the right ends of elements 53, 54 form poles which are included in propagation path C-D. However, when current is applied to conductor 25, appropriate blocking fields are produced wherein the bubbles follow the exchange paths. In particular, a bubble in position 2' follows the path including locations 2'-1, 2'-2 and 2'-3. Likewise, the bubble at location 2 follows the path including locations 2-1, 2-2 and 2-3 to location 3". As may be apparent, with the relocation of conductor 25, the time of application of the control current may be somewhat different from the application of the control current applied to the devices which form embodiments of FIGS. 3 and 4. Nevertheless, the basic principle still pertains.

Thus, there has been shown and described preferred embodiments of exchange switches which are utilized to exchange bubbles from adjacent propagation paths. As is noted, the exchange occurs during one cycle of a rotational field and within a single structural cycle. This exchange switch permits the optimization of the data throughput and chip area utilization. This exchange switch arrangement permits extremely compact bubble domain device organization. The bubble exchange may be made between two paths within a single cycle period wherein no wasted time or space is encountered. Moreover, information may be precisely exchanged between a pair of propagation paths concurrently. It is not necessary to have a pair of transfer switches or the like which requires excessive chip organizational space as well as propagation time.

Having thus described a preferred embodiment of the invention, what is claimed is:

1. A compact exchange switch for use in a magnetic bubble domain circuit comprising,
    first and second magnetic bubble domain propagation paths,
    first and second magnetic pole supporting elements of substantially similar configuration forming portions of said first propagation path,
    third and fourth magnetic pole supporting elements forming portions of said second propagation path and disposed adjacent to said first propagation path to form separate interconnecting paths between said first and second propagation paths, and
    conductor means disposed relative to all of said magnetic pole supporting elements wherein bubble domains are selectively and synchronously exchanged from said first propagation path to said second propagation path via said first and third pole supporting elements and from said second propagation path to said first propagation path via said second and fourth pole supporting elements, respectively, in response to the application of a single control current signal to said conductor means.

2. The switch recited in claim 1 wherein one of said third and fourth pole supporting elements is interposed between said first and second pole supporting elements.

3. The switch recited in claim 1 including
    a fifth magnetic pole supporting element disposed between said first and second magnetic pole supporting elements adjacent said first propagation path.

4. The switch recited in claim 3 wherein said third and fourth pole supporting elements are joined together by a common member.

5. The switch recited in claim 4 wherein
each of said third, fourth and fifth magnetic pole supporting elements is interposed between said first and second pole supporting elements and forms a portion of said first propagation path.

6. The switch recited in claim 4 wherein said third and fourth pole supporting elements form a twisted-H element, and
said fifth pole supporting element is an I-bar element joined to the cross-bar of said twisted-H element.

7. The switch recited in claim 3 wherein said
third and fourth pole supporting elements are each formed of one-half of a dollar-sign ($) switch, and
said fifth pole supporting element is an I-bar element interposed between said third and fourth pole supporting elements.

8. The switch recited in claim 1 wherein
each of said propagation paths comprise a plurality of H-bar and I-bar elements arranged to provide a path wherein magnetic pole supporting elements are established in response to magnetic fields,
said first and second pole supporting elements comprise I-bar elements disposed adjacent the ends of the last H-bar element in said first propagation path so as to be parallel to the I-bar elements in said first propagation path,
an end of each I-bar element of said first and second pole supporting elements arranged to form a portion of said first propagation path in a first operating condition,
said third and fourth pole supporting elements each formed of elongated magnetized elements, one end of which forms a portion of said second propagation path and the other end of which is disposed adjacent to said first propagation path.

9. The switch recited in claim 8 wherein said other end of at least one of said third and fourth pole supporting elements forms a portion of said first propagation path.

10. The switch recited in claim 1 wherein,
all of said magnetic pole supporting elements are fabricated at the same level.

11. The switch recited in claim 1 including,
a magnetic bubble domain supporting layer having a uniform anisotropy characteristic therein.

12. A compact exchange switch comprising
first and second propagation paths for magnetic bubble domains,
first and second magnetic pole supporting members joined together and extending between said first and second propagation paths and providing separate interconnecting paths between said first and second propagation paths, and
a single conductor disposed adjacent both of said first and second magnetic pole supporting members in order to selectively apply a magnetic field which permits magnetic bubble domains to be exchanged concurrently between said first and second propagation paths via the respective interconnecting poles formed by said first and second magnetic pole supporting members.

13. The switch recited in claim 12 wherein
said conductor forms a loop adjacent to said first and second magnetic pole supporting members.

14. The switch recited in claim 12 wherein
said first and second magnetic pole supporting members are disposed relative to said first and second propagation paths such that magnetic bubble domains which are exchanged concurrently are exchanged in synchronism relative to other bubble domains in said first and second propagation paths.

* * * * *